(12) United States Patent
Abel

(10) Patent No.: US 6,515,612 B1
(45) Date of Patent: Feb. 4, 2003

(54) METHOD AND SYSTEM TO REDUCE SIGNAL-DEPENDENT CHARGE DRAWN FROM REFERENCE VOLTAGE IN SWITCHED CAPACITOR CIRCUITS

(75) Inventor: Christopher John Abel, Coplay, PA (US)

(73) Assignee: Agere Systems, Inc., Allentown, PA (US)

( * ) Notice: Subject to any disclaimer, the term of this patent is extended or adjusted under 35 U.S.C. 154(b) by 0 days.

(21) Appl. No.: 10/001,794

(22) Filed: Oct. 23, 2001

(51) Int. Cl.$^7$ ................................................ H03M 1/00
(52) U.S. Cl. ..................... 341/172; 341/143; 327/93; 327/382; 327/554
(58) Field of Search ....................... 327/91, 93, 94, 327/95, 96, 337, 341, 382, 554; 333/173; 341/143, 172

(56) References Cited

U.S. PATENT DOCUMENTS

| | | | | |
|---|---|---|---|---|
| 4,918,454 A | * | 4/1990 | Early et al. ................. | 341/172 |
| 5,187,390 A | * | 2/1993 | Scott, III ...................... | 327/91 |
| 5,473,275 A | * | 12/1995 | Hughes et al. .............. | 327/336 |
| 5,617,054 A | | 4/1997 | Koifman et al. ............ | 327/362 |
| 5,638,020 A | | 6/1997 | Koifman et al. ............ | 327/382 |
| 5,790,064 A | | 8/1998 | Fujimori ..................... | 341/172 |
| 5,796,300 A | | 8/1998 | Morgan ......................... | 330/9 |
| 5,905,397 A | | 5/1999 | Koifman et al. ............ | 327/337 |
| 5,963,156 A | * | 10/1999 | Lewicki et al. ............. | 341/122 |
| 6,037,836 A | | 3/2000 | Youshiawa ..................... | 330/9 |
| 6,040,793 A | | 3/2000 | Ferguson, Jr. et al. ...... | 341/143 |
| 6,137,321 A | * | 10/2000 | Bazarjani ..................... | 327/96 |
| 6,169,427 B1 | * | 1/2001 | Brandt ........................ | 327/94 |
| 6,169,673 B1 | | 1/2001 | McIntyre et al. ............. | 363/59 |
| 6,191,631 B1 | | 2/2001 | Schambacher et al. ..... | 327/291 |
| 6,249,240 B1 | | 6/2001 | Bellaouar ................... | 341/172 |

* cited by examiner

*Primary Examiner*—Howard L. Williams
(74) *Attorney, Agent, or Firm*—Duane Morris LLP; Steven E. Koffs

(57) ABSTRACT

A circuit includes a first capacitor having a first terminal coupled to a first node having a first potential during a first time interval, and is coupled to a second node at a reference voltage during a second time interval. The first capacitor has a second terminal coupled to a third node having a common potential during the first time interval, and to an integrator during the second time interval. The first capacitor receives a first charge component from the second node that is dependent on the first potential during the second time interval. A second capacitor has a first terminal that is coupled to a fourth node having a second potential during the first time interval. The common potential is substantially midway between the first and second potentials. The second capacitor provides a second charge component that cancels the first charge component during the second interval.

32 Claims, 5 Drawing Sheets

METHOD AND SYSTEM TO REDUCE SIGNAL-DEPENDENT CHARGE DRAWN FROM REFERENCE VOLTAGE IN SWITCHED CAPACITOR CIRCUITS

FIELD OF THE INVENTION

The present invention relates to analog circuits generally, and more specifically to switched capacitor circuits.

BACKGROUND OF THE INVENTION

Switched-capacitor circuits form the core of a wide variety of analog and mixed-signal circuits, including pipelined A/D converters and Γ) A/D converters. Frequently, these circuits are configured so as to act on the difference between a time-varying input signal and a constant reference signal. For example, FIG. 1A shows a conventional switched-capacitor integrator.

The switched-capacitor integrator shown in FIG. 1A integrates the difference between $V_{IN}$ and a constant reference voltage, $V_{REF}$. During a first interval (clock phase φ1), capacitor 102 (having capacitance $C_1$) acquires a charge equal to $C_1 V_{IN}$. Then, during non-overlapping second interval (clock phase φ2), an additional charge equal to $C_1^*(V_{REF} - V_{IN})$ is forced onto capacitor 102 from the source 120 of voltage $V_{REF}$; and thus, by charge conservation, at the end of φ2, the total charge on capacitor 104 (which has capacitance $C_2$) is equal to $$C_2^* V_{OUT}(n-1) - C_1^*(V_{REF} - V_{IN}) = C_2^* V_{OUT}(n)$$

where $V_{OUT}(n)$ is the output of operational amplifier 106 at the end of phase φ2 and $V_{OUT}(n-1)$ is the output of operational amplifier 106 at the end of the previous φ2 phase. As a result, the cycle-by-cycle operation of this circuit follows Equation (1).

$$V_{OUT}(n) = V_{OUT}(n-1) + \frac{C_1}{C_2}(V_{IN}(n) - V_{REF}) \tag{1}$$

This is the equation of a discrete-time integrator.

In this configuration, the charge drawn from $V_{REF}$ during the second clock phase φ2 is given by $C_1^*(V_{REF} - V_{IN})$. This charge is strongly dependent on $V_{IN}$. If the source 120 of voltage $V_{REF}$ cannot fully settle by the end of phase φ2, the result is an integrator gain error, or worse, non-linearity if the circuit is part of an A/D converter.

The derivation of Equation (1) relies on a number of assumptions, including conformance of operational amplifier 106 to ideal properties (infinite gain and infinite bandwidth) and zero impedance at the output of the source 120 of voltage $V_{REF}$. If either of these assumptions is not met, the circuit of FIG. 1 does not perform precisely as indicated by Equation 1.

Reference is now made to FIG. 2A and an equivalent circuit representation in FIG. 2B. Assume that the reference voltage source 220 has an output resistance, R, and that a large capacitor, having capacitance $C_{BYP}$, is placed at the output of the voltage source 220 to bypass resistance R at high frequencies. Note that the operational amplifier is not shown in FIGS. 2A and 2B; instead, the bottom plate of capacitor 202 (having capacitance $C_1$) is shown permanently connected to ground. For analytical purposes, this is a valid substitution, because the operational amplifier 106 in FIG. 1 forces the bottom plate or terminal of capacitor 102 (capacitance $C_1$) to a virtual ground.

Assume that $C_{BYP} >> C_1$, and that the switching frequency of φ1 and φ2, $F_{CLK}$, is much greater than the reciprocal of the time constant $RC_{BYP}$ and also much greater than the bandwidth of $V_{IN}$. Then, the combination of switches $S_1$ 206 and $S_2$ 208 and capacitor 202 can be treated as a switched-capacitor resistor 230 (shown in FIG. 2B), with effective value $R_{SC} = 1/(F_{CLK} C_1)$. As indicated in FIGS. 2A and 2B, $V_{REF}'$, the "effective value of $V_{REF}$," which is the actual voltage sampled by capacitor 202 during clock phase χ2, is then equal to $$V_{REF}' \approx V_{REF} - (V_{REF} - V_{IN})\frac{R}{R + R_{SC}} \tag{2}$$

Applying this to Equation 1 results in $$V_{OUT}(n) = V_{OUT}(n-1) + \frac{C_1}{C_2}(V_{IN}(n) - V_{REF}'(n))$$

$$V_{OUT}(n) \approx V_{OUT}(n-1) + \frac{C_1}{C_2}\left(1 - \frac{R}{R_{SC}}\right)(V_{IN}(n) - V_{REF}) \tag{3}$$

Thus, the nonzero output impedance of the reference voltage source 220 results in an integrator gain error.

Referring now to FIG. 3, the standard way to address the problem described above is to use a separate capacitor 303 to sample $V_{REF}$. By using a separate capacitor 303 (with capacitance $C_3 = C_1$) to sample $V_{REF}$ during phase φ2, and then discharging capacitor 303 completely during phase φ1, a constant amount of charge is drawn from the reference voltage source 320 in each clock cycle.

In circuit 300, if $C_3 = C_1$, the difference equation for $V_{OUT}(n)$ is identical to Equation (1). Since capacitor 303 is always discharged to ground during φ1, a constant quantity of charge is delivered by $V_{REF}$ on every clock cycle. Thus, there is no signal-dependent error due to nonzero output impedance in the reference source.

Unfortunately, circuit 300 has a number of disadvantages. The additional capacitor 303 in the signal path increases the load on the operational amplifier 306. During the integration phase, φ2, there is twice as much capacitance between the inverting operational amplifier input and ground as there is in the circuit 100 in FIG. 1, doubling the load that must be driven by the operational amplifier ($C_1 + C_3$ vs. $C_1$). This extra load capacitance degrades the setting performance of the operational amplifier. It also reduces the feedback factor, $C_2/(C_1 + C_3 + C_2)$, thus decreasing the closed-loop bandwidth of the switched-capacitor circuit and degrading its settling time. Further, it reduces the closed loop gain of the operational amplifier. In addition, it doubles the thermal (kT/C) noise. Because this circuit has two independent sampling capacitors, the input-referred kT/C thermal noise is 3 dB higher than in the circuit of FIG. 1.

An improved switched capacitor circuit is desired that eliminates signal-dependent error due to nonzero output impedance in the reference source without doubling the load on the operational amplifier.

SUMMARY OF THE INVENTION

One aspect of the invention is a circuit assembly, comprising an integrator and first and second capacitors. The first capacitor has a first terminal that is coupled to a first node having a first potential during a first time interval. The first terminal is coupled to a second node at a reference voltage during a second time interval that does not overlap the first time interval. The first capacitor has a second terminal that is coupled to a third node having a common potential during the first time interval. The second terminal is coupled to the integrator during the second time interval. The first capacitor receives a first charge component from the second node that is dependent on the first potential during the second time interval.

The second capacitor has a first terminal that is coupled to a fourth node having a second potential during the first time interval. The common potential is substantially midway between the first and second potentials. The second capacitor provides a second charge component that cancels the first charge component during the second interval.

BRIEF DESCRIPTION OF THE DRAWINGS

In FIGS. 1A–5, all switches designated "φ1" are closed during phase φ1 and open during phase φ2. All switches designated "φ2" are closed during phase φ2 and open during phase φ1.

FIG. 1A is schematic diagram of a first conventional switched capacitor circuit.

FIGS. 1B and 1C are timing diagrams showing the timing of the two clock phases, N1 and N2.

FIG. 3 is a schematic diagram of a conventional switched capacitor circuit configured to eliminate signal dependent variations in the reference voltage.

FIG. 4 is a schematic diagram of a first exemplary embodiment of the invention.

FIG. 5 is a schematic diagram of a second exemplary embodiment of the invention.

OVERVIEW

The present invention is a circuit and method for reducing signal-dependent charge drawn from a reference voltage buffer in a switched capacitor circuit. The exemplary embodiments of the invention reduce the impact of nonzero reference voltage output impedance on switched-capacitor circuits compared to the prior art circuit shown in FIG. 1.

In the exemplary embodiments, a first capacitor samples an input signal $V_{IN}$ during time interval φ1 and a reference voltage $V_{REF}$ during time interval φ2. During the first interval φ1, a second capacitor samples a signal that is the mirror image of the input signal, taken about a common voltage, which may be ground or the common mode voltage in a fully balanced circuit. The reference voltage source(s) provides first and second charges to the respective first and second capacitors during phase φ2. The first and second charges correspond to the charges transferred from the first and second capacitors to the integrator. Each of the first and second charges includes a first charge component dependent on the reference voltage and a second charge component dependent on the input signal. The first charge components add constructively, and the second charge components, which are dependent on the input signal, add destructively (i.e., cancel each other out), so that the charge provided by the reference voltage source during phase φ2 is independent of the input signal.

Figure 4:
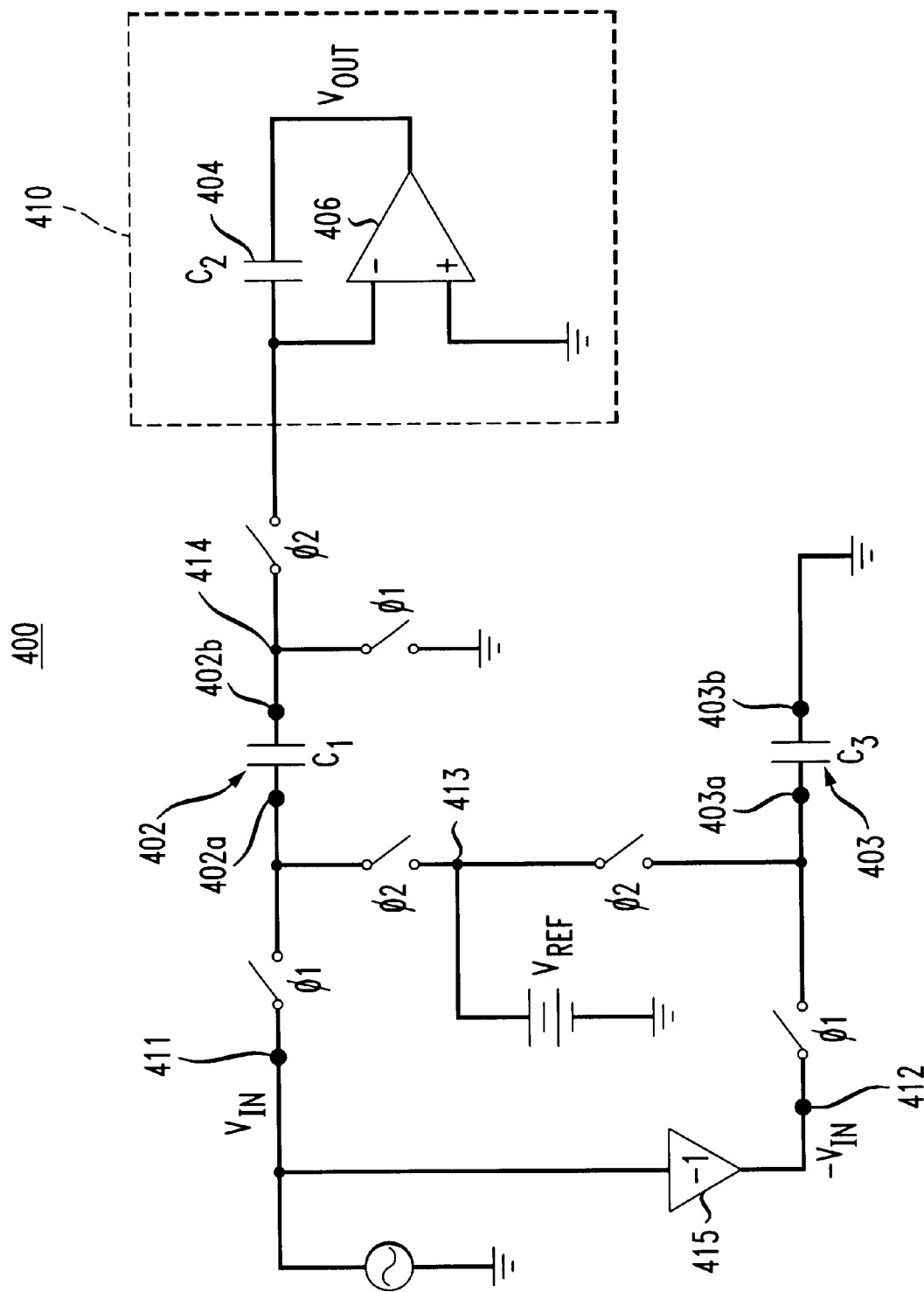

FIG. 4 shows a first exemplary embodiment of the invention. A circuit assembly 400 has an integrator 410 and first and second capacitors 402 and 403, respectively. The first capacitor 402 has a first terminal 402a that is coupled to a first node 411 having a first potential $V_{IN}$ during a first time interval φ1. The first terminal 402a is coupled to a second node 413 at a reference voltage $V_{REF}$ during a second time interval φ2 that does not overlap the first time interval φ1. The first capacitor 402 has a second terminal 402b that is coupled to a third node 414 having a common potential during the first time interval φ1. The second terminal 402b is coupled to the integrator 410 during the second time interval φ2. The first capacitor 402 receives a first charge component from the second node 413 that is dependent on the first potential $V_{IN}$ during the second time interval φ2.

The second capacitor 403 has a first terminal 403a that is coupled to a fourth node 412 having a second potential $-V_{IN}$ during the first time interval φ1. The common potential (ground in FIG. 4) is substantially midway between the first and second potentials $V_{IN}$ and $-V_{IN}$. The second capacitor 403 provides a second charge component that cancels the first charge component during the second interval φ2.

More particularly, in the exemplary embodiment of FIG. 4, circuit assembly 400 has an integrator 410, an inverter 415 that receives an input signal $V_{IN}$ and outputs an inverted signal $-V_{IN}$, and capacitors 402 and 403. The first capacitor 402 has a first terminal 402a that is coupled to receive the input signal $V_{IN}$ during the first time interval φ1 and is coupled to receive a reference voltage signal $V_{REF}$ during the second time interval φ2 that does not overlap the first time interval φ1. Capacitor 402 has a second terminal 402b coupled to ground during the first time interval φ1 and to the integrator 410 during the second time interval φ2. Capacitor 403 has a first terminal 403a that is coupled to receive the inverted signal $-V_{IN}$ during the first time interval φ1, and is coupled to receive the reference voltage signal $V_{REF}$ and coupled to the first terminal 402a of the first capacitor 402 during the second time interval φ2.

Figure 5:
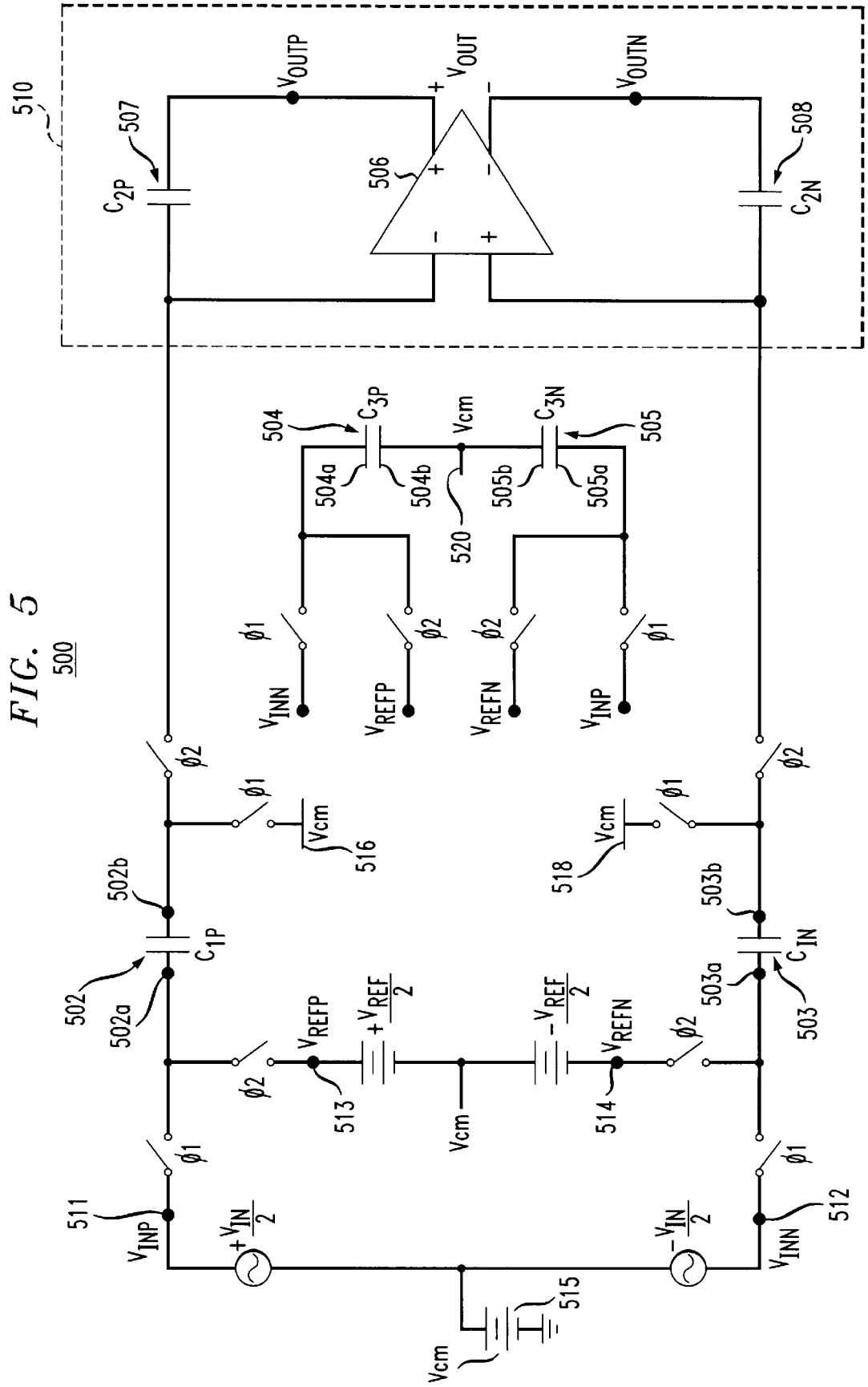

FIG. 5 shows a second exemplary embodiment of the invention, which is a fully balanced implementation, and thus does not require an inverter. The circuit assembly 500 has means for receiving first and second input signals $V_{INP}$ and $V_{INN}$, which are connected to input nodes 511 and 512, respectively. A common potential $V_{CM}$ is substantially midway between respective voltages $V_{INP}(=V_{CM}+V_{IN}/2)$ and $V_{INN}(=V_{CM}-V_{IN}/2)$ of the first and second input signals. Thus the first and second input signals are mirror images of each other around the common potential. Further, the difference between the first and second input signals is equal to a primary input signal, $V_{IN}$, that is $V_{INP}-V_{INN}=V_{IN}$. The common potential is also substantially midway between a first reference voltage, $V_{REFP}(=V_{CM}+V_{REF}/2)$, and a second reference voltage, $V_{REFN}(=V_{CM}-V_{REF}/2)$.

A first capacitor 502 of a first capacitor pair (502, 504) has a first terminal 502a that is coupled to receive the first input signal $V_{INP}$ during a first time interval φ1, and is coupled to receive the first reference voltage $V_{REFP}$ during a second time interval φ2 that does not overlap the first time interval. The first capacitor 502 of the first capacitor pair has a second terminal 502b that is coupled to a first node 516 having the common potential $V_{CM}$ during the first time interval φ1 and to an integrator 510 during the second time interval φ2. A first capacitor 503 of the second capacitor pair (503, 505) has a first terminal 503a that is coupled to receive the second input signal $V_{INN}$ during a first time interval φ1, and is coupled to receive the second reference voltage $V_{REFN}$ during a second time interval φ2 that does not overlap the first time interval. The first capacitor 503 of the second capacitor pair has a second terminal 503b that is coupled to a first node 518 having the common potential $V_{CM}$ during the first time interval φ1 and to integrator 510 during the second time interval φ2.

A second capacitor 504 of the first capacitor pair (502, 504) has a first terminal 504a that is coupled to receive the second input signal $V_{INN}$ during the first time interval $\phi1$, and is coupled to receive the first reference voltage $V_{REFP}$ during the second time interval $\phi2$. The second capacitor 504 of the first capacitor pair has a second terminal 504b that is coupled to a node 520 having the common potential $V_{CM}$ during both the first time interval $\phi1$ and the second time interval $\phi2$. A second capacitor 505 of the second capacitor pair (503, 505) has a first terminal 505a that is coupled to receive the first input signal $V_{INP}$ during the first time interval $\phi1$, and is coupled to receive the second reference voltage $V_{REFN}$ during the second time interval $\phi2$. The second capacitor 505 of the second capacitor pair has a second terminal 505b that is coupled to a node 520 having the common potential $V_{CM}$ during both the first time interval $\phi1$ and the second time interval $\phi2$.

The first capacitor 502 of the first capacitor pair receives a first charge component from the first reference voltage $V_{REFP}$ which is dependent on the first input signal $V_{INP}$ during the second time interval $\phi2$. The second capacitor 504 of the first capacitor pair receives a second charge component from the first reference voltage $V_{REFP}$ which is dependent on the second input signal $V_{INN}$ during the second time interval $\phi2$. Since the first and second input signals are mirror images of each other, the second charge component cancels the portion of the first charge component which is dependent on the primary input signal $V_{IN}$. Similarly, the first capacitor 503 of the second capacitor pair receives a third charge component from the second reference voltage $V_{REFN}$ which is dependent on the second input signal $V_{INN}$ during the second time interval $\phi2$. The second capacitor 505 of the second capacitor pair receives a fourth charge component from the second reference voltage $V_{REFN}$ which is dependent on the first input signal $V_{INP}$ during the second time interval $\phi2$. Since the first and second input signals are mirror images of each other, the fourth charge component cancels the portion of the third charge component which is dependent on the primary input signal $V_{IN}$.

In both of the exemplary embodiments, signal-dependent error due to non-zero output impedance in the reference voltage source(s) is eliminated. The exemplary embodiments are described in detail below.

DETAILED DESCRIPTION

Reference is made herein to capacitors having terminals. As used herein, the term "capacitor" may refer to a discrete device or to any capacitive circuit element (e.g., printed wirings or patterns in an integrated circuit). Similarly, with respect to capacitors, the term, "terminals" as used herein may refer to an actual terminal of a discrete device, or to input and output nodes or conductors of a capacitance element in a printed wiring board or an integrated circuit.

Figure 1A:
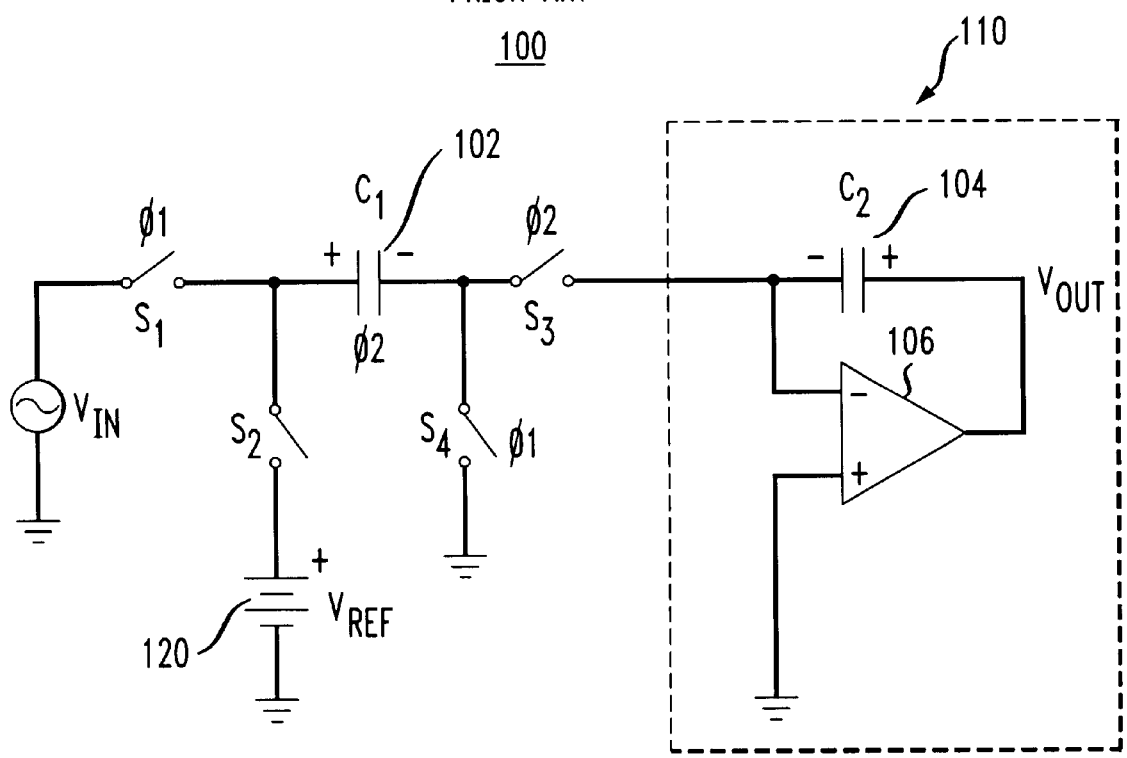
Figure 1A:
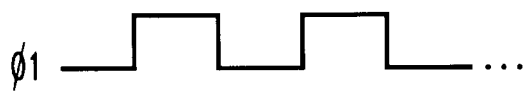
Figure 1A:

Reference is again made to FIG. 4. In circuit 400, the common voltage is ground, and the second input signal $-V_{IN}$ is formed by inverting the first input signal $V_{IN}$. In circuit 400, capacitor 402 (having capacitance $C_1$) samples the input signal $V_{IN}$ during phase $\phi1$ and then has its first terminal 402a switched to the reference signal $V_{REF}$ during the integration phase $\phi2$. The same amount of charge is transferred to a third capacitor 404 (having capacitance $C_2$) during $\phi2$ as in the circuit of FIG. 1A; thus, the input-output transfer function of the circuit of FIG. 1 is preserved, and the difference equation that describes $V_{OUT}(n)$ in circuit 400 is identical to (Eq. 1).

A second capacitor 403 (having capacitance $C_3=C_1$) is used to sample the inverted input voltage $-V_{IN}$ while the first capacitor 402 samples the input signal $+V_{IN}$. Capacitor 403 is not part of the signal path from input node 411 to integrator 410. During the second interval $\phi2$, both first capacitor 402 and second capacitor 403 are switched to be connected to $V_{REF}$. The reference-dependent charge components add constructively, and the signal-dependent charge components cancel each other out.

Because the reference-dependent charge components add constructively, the presence of capacitor 403 alters the amount of charge drawn from $V_{REF}$ in each clock cycle. For circuit 400, during $\phi2$, $V_{REF}$ delivers a total charge equal to $$Q_{VREF} \approx C_1*(V_{REF}-V_{IN})+C_3(V_{REF}-(-V_{IN})) \approx 2C_1 V_{REF} \quad \text{(Eq. 4)}$$

where it is assumed that $C_3=C_1$. Thus, in this case, if the voltage reference has a nonzero output impedance, the effective value of $V_{REF}$ which is sampled by capacitor 402 during phase $\phi2$ no longer has a signal-dependent component, in contrast to the problem observed with the circuit 200 in FIG. 2A. In this case, if the voltage reference does not completely settle at the end of phase $\phi2$, the effective value of $V_{REF}$ which is sampled by capacitor 402 on the falling edge of interval $\phi2$ no longer has a signal-dependent component.

Figure 3:
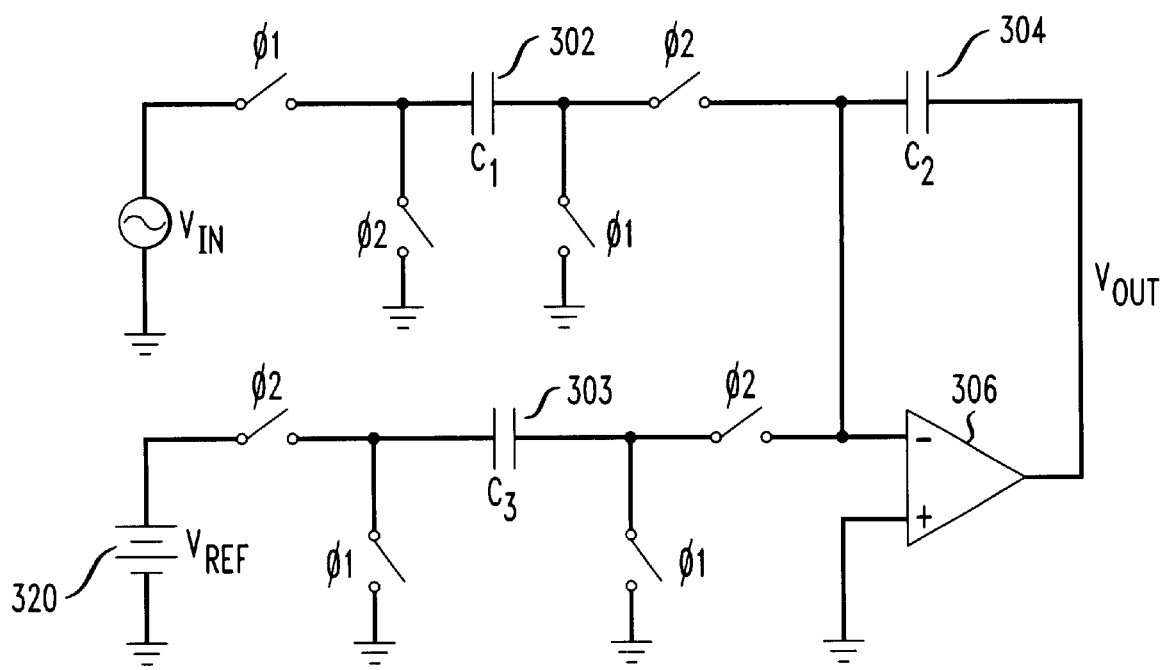

Note that unlike the circuit of FIG. 3, in circuit assembly 400, capacitor 403 is not connected to the inverting terminal of amplifier 406 in parallel with capacitor 402, and thus has no effect on loop gain or settling time, and adds no noise to the circuit output. From a load perspective, amplifier 406 does not "see" capacitor 403.

Although the single-ended circuit assembly 400 of FIG. 4 includes an inverting gain amplifier to generate the second input signal $-V_{IN}$ from the first input signal $+V_{IN}$, it is understood that a circuit according to the invention may be used in a system that already provides both $+V_{IN}$ and $-V_{IN}$ signals, in which case node 412 can connect directly to an external source of the second ($-V_{IN}$) input signal. For example, another circuit within the same system may include an inverter that provides the second ($-V_{IN}$) signal.

This integrator 410 of FIG. 4 has substantially the same settling time and loop gain as the integrator of FIG. 1A, while eliminating the signal-dependent charge as completely as is done by the integrator 310 of FIG. 3.

Although this single-ended circuit of FIG. 4 uses an inverting gain amplifier to generate $-V_{IN}$, in a balanced implementation, such as the one shown in FIG. 5, no additional inversion is necessary.

Circuit assembly 500 in FIG. 5 operates like a pair of the circuits 400 of FIG. 4, of which one circuit operates on the positive half of the output, and the other half operates on the negative half of the output. A common potential reference voltage source 515 provides a common potential $V_{CM}$. In a typical circuit, $V_{cm}$ is midway between power $V_{dd}$ and ground $V_{ss}$. For example, if $V_{dd}$ is 5 Volts and $V_{ss}$ is zero volts, $V_{cm}$ may be 2.5 volts. Nevertheless, $V_{cm}$ may have another value and is not required to be $(V_{dd}+V_{ss})/2$. $V_{CM}$ is substantially midway between respective voltages $V_{INP}(=V_{CM}+V_{IN}/2)$ and $V_{INN}(=V_{CM}-V_{IN}/2)$ of the first and second input signals. Thus the first and second input signals are mirror images of each other around the common potential. Further, the difference between the first and second input signals is equal to a primary input signal, $V_{IN}$, that is $V_{INP}-V_{INN}=V_{IN}$. The common potential is also substantially midway between a first reference voltage, $V_{REFP}(=V_{CM}+V_{REF}/2)$, and a second reference voltage, $V_{REFN}(=V_{CM}-V_{REF}/2)$.

In circuit 500, the first capacitor 502 (having capacitance $C_{1P}=C_1$) of the first capacitor pair samples the difference between the first input signal $V_{INP}$ and the common potential $V_{CM}$, receiving a charge equal to $C_1*(V_{IN}/2)$ during the first time interval φ1. Then capacitor 502 samples the difference between the first reference voltage $V_{REFP}$ and the $V_{CM}$, receiving a charge $Q_{1P}$ equal to $Q_{1P}=C_1*(V_{REF}/2-V_{IN}/2)$ from the first reference voltage during the second time interval φ2. The same amount of charge is transferred to capacitor 507 (having capacitance $C_2P=C_2$) such that a first integrator output voltage $V_{OUTP}$ is equal to $V_{OUTP}(n)=V_{OUTP}(n-1)-(C_1/C_2)*(V_{REF}/2-V_{IN}/2)$. Similarly, the first capacitor 503 (having capacitance $C_{1N}=C_1$) of the second capacitor pair samples the difference between the second input signal $V_{INN}$ and the common potential $V_{CM}$, receiving a charge equal to $-C_1*(V_{IN}/2)$ during the first time interval φ1. Then capacitor 503 samples the difference between the second reference voltage $V_{REFN}$ and the $V_{CM}$, receiving a charge $Q_{IN}$ equal to $Q_{IN}=C_1*(V_{REF}/2-V_{IN}/2)$ from the second reference voltage during the second time interval φ2. The same amount of charge is transferred to capacitor 508 (having capacitance $C_{2N}=C_2$) such that a second integrator output voltage $V_{OUTN}$ is equal to $V_{OUTN}(n)=V_{OUTN}(n-1)+(C_1/C_2)*(V_{REF}/2-V_{IN}/2)$. Thus, the differential integrator output voltage $V_{OUT}$, which is equal to $V_{OUT}=V_{OUTP}-V_{OUTN}$, is described by the following difference equation $$V_{OUT}(n)=V_{OUT}(n-1)+(C_1/C_2)*(V_{IN}-V_{REF}) \quad (Eq. 5)$$

which matches the difference equation of (Eq. 1).

During the first time interval φ1, the second capacitor 504 (having capacitance $C_{3P}=C_1$) of the first capacitor pair samples the difference between the second input signal $V_{INN}$ and the common potential $V_{CM}$, receiving a charge equal to $C_1*(V_{IN}/2)$ during the first time interval φ1. Then capacitor 504 samples the difference between the first reference voltage $V_{REFP}$ and the $V_{CM}$, receiving a charge $Q_{2P}$ equal to $Q_{2P}=C_1*(V_{REF}/2+V_{IN}/2)$ from the first reference voltage during the second time interval φ2. Similarly, during the first time interval φ1, the second capacitor 505 (having capacitance $C_{3N}=C_1$) of the second capacitor pair samples the difference between the first input signal $V_{INP}$ and the common potential $V_{CM}$, receiving a charge equal to $C_1*(V_{IN}/2)$ during the first time interval φ1. Then capacitor 505 samples the difference between the second reference voltage $V_{REFN}$ and the $V_{CM}$, receiving a charge $Q_{2N}$ equal to $$Q_{2N}=-C_1*(V_{REF}/2+V_{IN}/2)$$

from the second reference voltage during the second time interval φ2.

Thus, the total charge $Q_{VREFP}$ delivered by the first reference voltage is equal to $$Q_{VREFP}=Q_{1P}+Q_{2P}=C_1*(V_{REF}/2-V_{IN}/2)+C_1*(V_{REF}/2+V_{IN}/2)=C_1*(V_{REF} \quad (Eq. 6)$$

Similarly, the total charge $Q_{VREFN}$ delivered by the second reference voltage is equal to $$Q_{VREFN}=Q_{IN}+Q_{2N}=-C_1*(V_{REF}/2-V_{IN}/2)-C_1*(V_{REF}/2+V_{IN}/2)=-C_1*(V_{REF} \quad (Eq. 7)$$

In both cases, the reference-dependent charge components add constructively, while the signal-dependent charge components add destructively, and thus, the presence of capacitors 504 and 505 alters the amount of charge drawn from $V_{REFP}$ and $V_{REFN}$ during each clock cycle. If the first and second voltage references have nonzero output impedance, then the effective values of $V_{REFP}$ and $V_{REFN}$ sampled by capacitors 502 and 503 during the second time interval φ2 no longer have signal-dependent components.

Figure 2A:
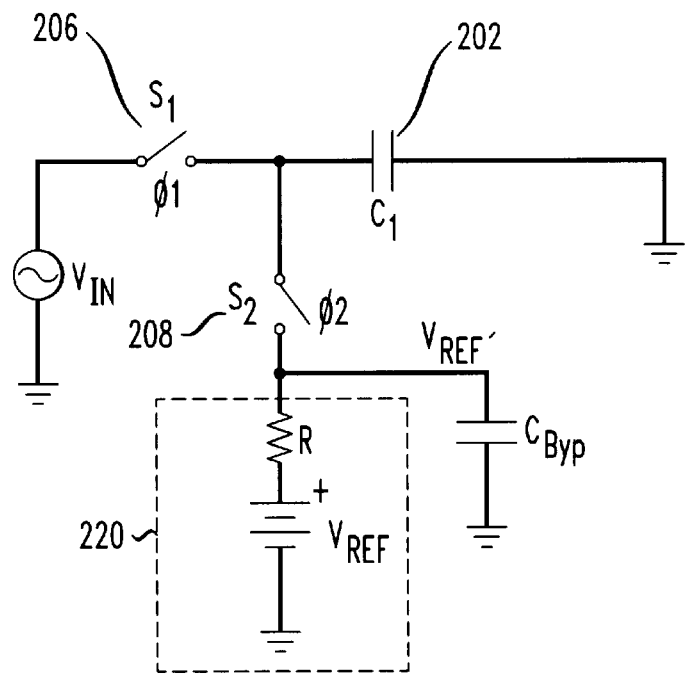
FIGS. 2A and 2B are schematic diagrams of conventional switched capacitor circuits wherein the reference voltage source has an output resistance.
Figure 2B:
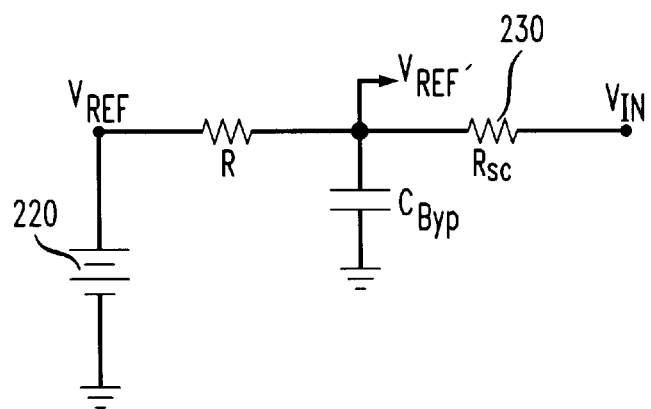

Although the analysis of FIGS. 1A, 2A and 2B above showed only integrator gain error as the possible negative consequence of nonzero output impedance, for switched-capacitor circuits used in A/D converters, the consequences are more significant. In essence, an A/D converter samples a time-varying input signal, $V_{IN}$, and quantizes the quantity $V_{IN}/V_{REF}$ to one of a finite number of fractions between −1 and 1 (or 0 and 1). It is assumed that $V_{REF}$ is a time-invariant quantity. If, however, $V_{REF}$ has a time-varying term (as does the "effective" $V_{REF}$ in FIG. 2A), then the quantity $V_{IN}/V_{REF}$ contains distortion products which are then present in the A/D output.

The present invention can significantly ease the requirement for voltage reference output impedance, without degrading operational amplifier settling or gain performance.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A circuit assembly, comprising:
   an integrator;
   a first capacitor having a first terminal that is coupled to a first node having a first potential during a first time interval and is coupled to a second node at a reference voltage during a second time interval that does not overlap the first time interval, the first capacitor having a second terminal that is coupled to a third node having a common potential during the first time interval and to the integrator during the second time interval, the first capacitor receiving a first charge component from the second node that is dependent on the first potential during the second time interval; and
   a second capacitor having a first terminal that is coupled to a fourth node having a second potential during the first time interval, the common potential being substantially midway between the first and second potentials, the second capacitor providing a second charge component that cancels the first charge component during the second interval.

2. The circuit assembly of claim 1, wherein the common potential is ground, and the second potential is substantially equal in magnitude to the first potential and phase inverted relative to the first input signal.

3. The circuit assembly of claim 1, wherein the second capacitor is coupled to the second node during the second time interval.

4. The circuit assembly of claim 3, wherein the first capacitor is connected between the second capacitor and the integrator during the second time interval.

5. The circuit assembly of claim 1, wherein the first capacitor is connected between the second capacitor and the integrator during the second time interval.

6. The circuit assembly of claim 1, further comprising an inverter having an input coupled to the first node and an output coupled to the fourth node.

7. The circuit assembly of claim 1, wherein the second terminal of the first capacitor is connected to ground during the first time interval.

8. The circuit assembly of claim 1, wherein the second terminal of the second capacitor to is connected to ground during the first time interval.

9. The circuit assembly of claim 1, wherein the first terminal of the second capacitor is connected to a fifth node having a second reference voltage during the second time interval.

10. The circuit assembly of claim 9, the integrator has positive and minus terminals connected separately to the second terminals of the first and second capacitors during the second time interval.

11. The circuit assembly of claim 9, wherein the common voltage is substantially midway between the first and second reference voltages.

12. The circuit assembly of claim 9, wherein the second terminal of the second capacitor is connected to the common voltage during the first interval.

13. A circuit assembly, comprising:

an integrator;

an inverter that receives the input signal and outputs an inverted signal;

a first capacitor having a first terminal that is coupled to receive the input signal during a first time interval and is coupled to receive a reference voltage signal during a second time interval that does not overlap the first time interval, the first capacitor having a second terminal coupled to ground during the first time interval and to the integrator during the second time interval; and a second capacitor having a first terminal that is coupled to receive the inverted signal during the first time interval, and is coupled to receive the reference voltage signal and coupled to the first terminal of the first capacitor during the second time interval.

14. A circuit assembly, comprising:

an integrator;

means for receiving first and second input signals and first and second reference voltages, such that a common potential is substantially midway between respective voltages of the first and second input signals and substantially midway between respective first and second reference voltages;

a first capacitor having a first terminal that is coupled to receive the first input signal during a first time interval and is coupled to receive the first reference voltage during a second time interval that does not overlap the first time interval, the first capacitor having a second terminal, the voltage of which is the common potential during the first time interval, the second terminal of the first capacitor being coupled to the integrator during the second time interval;

a second capacitor having a first terminal that is coupled to receive the second input signal during the first time interval, and is coupled to receive the first reference voltage during the second time interval, the second capacitor having a second terminal, the voltage of which is the common potential;

a third capacitor having a first terminal that is coupled to receive the second input signal during the first time interval and is coupled to receive the second reference voltage during the second time interval, the third capacitor having a second terminal, the voltage of which is the common potential during the first time interval, the second terminal of the third capacitor being coupled to the integrator during the second time interval; and a fourth capacitor having a first terminal that is coupled to receive the first input signal during the first time interval, and is coupled to receive the second reference voltage during the second time interval, the second capacitor having a second terminal, the voltage of which is the common potential.

15. The circuit assembly of claim 14, wherein the first capacitor receives a first charge component from a source of the first reference voltage signal during the second time interval, the first charge component being dependent on the first input signal, and the second capacitor provides a second charge component to the source of the first reference voltage that cancels the first charge component during the second interval.

16. The circuit assembly of claim 14, wherein the third capacitor receives a first charge component from a source of the second reference voltage signal during the second time interval, the second reference voltage signal being dependent on the second input signal, and the fourth capacitor provides a second charge component to the source of the second reference voltage that cancels the first charge component during the second interval.

17. The circuit assembly of claim 15, wherein the first capacitor is coupled to a minus input of the integrator, and the third capacitor is coupled to a positive input of the integrator.

18. The circuit assembly of claim 17, wherein the integrator includes:

an operational amplifier, a fifth capacitor connected between a positive output of the operational amplifier and a minus input of the operational amplifier, and a sixth capacitor connected between a minus output of the operational amplifier and a positive input of the operational amplifier.

19. The circuit assembly of claim 18, wherein the first, second, third, fourth, fifth and sixth capacitors have the same capacitance.

20. The circuit assembly of claim 14, wherein the first, second, third and fourth capacitors have the same capacitance.

21. A method for processing a first input signal, comprising the steps of:

(a) sampling the first input signal with a first capacitor during a first time interval;

(b) sampling a second input signal with a second capacitor during the first time interval, wherein a value of a common voltage is substantially midway between respective values of the first and second input signals;

(c) applying a charge to the first capacitor with a reference voltage signal during a second time interval that does not overlap the first time interval, the charge having a component that depends on the first input signal; and (d) canceling the component of the charge using the second capacitor.

22. The method of claim 21, wherein the common voltage is ground, and the second input signal is substantially equal in magnitude to the first input signal and phase inverted relative to the first input signal.

23. The method of claim 21, wherein step (d) includes sampling the reference voltage signal with the second capacitor during the second time interval.

24. The method of claim 23, wherein step (d) includes coupling the first capacitor between the second capacitor and an integrator during the second time interval.

25. The method of claim 21, wherein step (d) includes coupling the first capacitor between the second capacitor and an integrator during the second time interval.

26. The method of claim 21, further comprising the step of inverting the first input signal to form the second input signal.

27. The method of claim 21, further comprising coupling a terminal of the first capacitor to ground during the first time interval.

28. The method of claim 21, further comprising coupling a terminal of the second capacitor to ground during the first time interval.

29. The method of claim 21, wherein step (d) includes sampling a second reference voltage signal with the second capacitor during the second time interval.

30. The method of claim 29, further comprising connecting second terminals of the first and second capacitors separately to the positive and minus terminals of the integrator during the second time interval.

31. The method of claim 28, wherein the common voltage is substantially midway between the first and second reference voltages.

32. The method of claim 28, the method further comprising coupling respective terminals of the first and second capacitors to respective nodes at the common voltage during the first interval.

* * * * *